United States Patent
Huston et al.

(10) Patent No.: US 9,837,250 B2
(45) Date of Patent: Dec. 5, 2017

(54) HOT WALL REACTOR WITH COOLED VACUUM CONTAINMENT

(71) Applicant: APPLIED MATERIALS, INC., Santa Clara, CA (US)

(72) Inventors: Joel M. Huston, San Jose, CA (US); Olkan Cuvalci, Sunnyvale, CA (US); Michael P. Karazim, San Jose, CA (US); Joseph Yudovsky, Campbell, CA (US)

(73) Assignee: APPLIED MATERIALS, INC., Santa Clara, CA (US)

(*) Notice: Subject to any disclaimer, the term of this patent is extended or adjusted under 35 U.S.C. 154(b) by 627 days.

(21) Appl. No.: 14/332,775

(22) Filed: Jul. 16, 2014

(65) Prior Publication Data

US 2015/0059981 A1 Mar. 5, 2015

Related U.S. Application Data (60) Provisional application No. 61/872,282, filed on Aug. 30, 2013.

(51) Int. Cl.
*H01J 37/32* (2006.01)
*C23C 16/44* (2006.01)
(Continued)

(52) U.S. Cl.
CPC .... *H01J 37/32477* (2013.01); *C23C 16/4401* (2013.01); *C23C 16/4408* (2013.01);
(Continued)

(58) Field of Classification Search
CPC ........... H01J 37/32477; H01J 37/32522; H01J 37/32724; H01J 37/32513; C23C 16/4401;
(Continued)

(56) References Cited

U.S. PATENT DOCUMENTS 5,271,963 A * 12/1993 Eichman ................. C23C 16/34
118/719
5,788,799 A * 8/1998 Steger ................... B08B 7/0042
134/1.1

(Continued)

FOREIGN PATENT DOCUMENTS

KR 10-2008-0100056 A 11/2008

OTHER PUBLICATIONS

International Search Report and Written Opinion dated Oct. 29, 2014 for PCT Application PCT/US2014/047126.

*Primary Examiner* — Jeffrie R Lund (74) *Attorney, Agent, or Firm* — Moser Taboada; Alan Taboada (57) ABSTRACT

Methods and apparatus for processing substrates are provided herein. In some embodiments, an apparatus for processing substrates includes a chamber body enclosing a processing volume, the chamber body comprising a chamber floor, a chamber wall coupled to the chamber floor, and a chamber lid removably coupled to the chamber wall, wherein at least one of the chamber floor, the chamber wall, and the chamber lid comprise passages for a flow of a thermal control media; a heater plate disposed adjacent to and spaced apart from the chamber floor; a sleeve disposed adjacent to and spaced apart from the chamber wall, the sleeve supported by the heater plate; and a first sealing element disposed at a first interface between the chamber wall and the chamber lid.

19 Claims, 3 Drawing Sheets

(51) Int. Cl.
    *C23C 16/455*     (2006.01)
    *C23C 16/46*     (2006.01)

(52) U.S. Cl.
    CPC .... *C23C 16/4409* (2013.01); *C23C 16/45519* (2013.01); *C23C 16/45521* (2013.01); *C23C 16/46* (2013.01); *H01J 37/32513* (2013.01); *H01J 37/32522* (2013.01); *H01J 37/32724* (2013.01)

(58) Field of Classification Search
    CPC ............ C23C 16/4404; C23C 16/4408; C23C 16/4409; C23C 16/45519; C23C 16/45521; C23C 16/46
    USPC .................................................. 118/715, 724
    See application file for complete search history.

(56) References Cited

U.S. PATENT DOCUMENTS

| | | | |
|---|---|---|---|
| 6,364,954 B2 * | 4/2002 | Umotoy | C23C 16/4401 118/715 |
| 6,408,786 B1 | 6/2002 | Kennedy et al. | |
| 6,582,522 B2 * | 6/2003 | Luo | C23C 16/4401 118/715 |
| 6,884,297 B2 * | 4/2005 | Park | H01L 21/6719 118/715 |
| 8,444,926 B2 * | 5/2013 | Fodor | C23C 16/46 118/722 |
| 8,911,553 B2 * | 12/2014 | Baluja | C23C 16/4405 118/715 |
| 9,653,267 B2 * | 5/2017 | Carducci | H01J 37/32495 |
| 2001/0054381 A1 * | 12/2001 | Umotoy | C23C 16/4401 118/715 |
| 2003/0010451 A1 * | 1/2003 | Tzu | C23C 16/45512 156/345.33 |
| 2003/0033978 A1 * | 2/2003 | Zhao | C23C 16/4402 118/715 |
| 2003/0198754 A1 * | 10/2003 | Xi | C23C 16/45512 427/576 |
| 2004/0187780 A1 * | 9/2004 | Park | H01L 21/6719 118/715 |
| 2005/0205110 A1 * | 9/2005 | Kao | H01J 37/32082 134/1.1 |
| 2008/0063798 A1 * | 3/2008 | Kher | C23C 16/34 427/255.394 |
| 2008/0178797 A1 | 7/2008 | Fodor et al. | |
| 2010/0003406 A1 * | 1/2010 | Lam | C23C 16/4412 427/255.391 |
| 2011/0136346 A1 | 6/2011 | Geissbuhler et al. | |
| 2011/0147363 A1 | 6/2011 | Yap et al. | |
| 2012/0009765 A1 * | 1/2012 | Olgado | C23C 16/45508 438/478 |
| 2012/0244684 A1 * | 9/2012 | Suzuki | C23C 16/45517 438/478 |
| 2013/0087286 A1 * | 4/2013 | Carducci | H05H 1/46 156/345.43 |
| 2013/0105085 A1 | 5/2013 | Yousif et al. | |
| 2013/0118686 A1 * | 5/2013 | Carducci | H01J 37/32495 156/345.1 |
| 2014/0190405 A1 * | 7/2014 | Chang | C23C 16/4407 118/70 |
| 2015/0059981 A1 * | 3/2015 | Huston | H01J 37/32522 156/345.52 |

* cited by examiner

HOT WALL REACTOR WITH COOLED VACUUM CONTAINMENT

CROSS-REFERENCE TO RELATED APPLICATIONS

This application claims benefit of U.S. provisional patent application Ser. No. 61/872,282, filed Aug. 30, 2013, which is herein incorporated by reference in its entirety.

FIELD

Embodiments of the present invention generally relate to substrate processing equipment.

BACKGROUND

Substrate processing systems, such as plasma reactors, may be used to deposit, etch, or form layers on a substrate supported within a processing chamber. Some processing systems may include a chamber providing a vacuum boundary and a hot inner wall. The vacuum boundary often includes seal elements between component parts of the chamber to facilitate formation of a vacuum tight seal. The inventors have observed that heat from the hot wall can negatively impact the performance of the seals used.

Thus, the inventors have provided herein embodiments of substrate process chambers and chamber components that may provide improved performance of the seals or other benefits as described below.

SUMMARY

Methods and apparatus for processing substrates are provided herein. In some embodiments, an apparatus for processing substrates includes a chamber body enclosing a processing volume, the chamber body comprising a chamber floor, a chamber wall coupled to the chamber floor, and a chamber lid removably coupled to the chamber wall, wherein at least one of the chamber floor, the chamber wall, and the chamber lid comprise passages for a flow of a thermal control media; a heater plate disposed adjacent to and spaced apart from the chamber floor; a sleeve disposed adjacent to and spaced apart from the chamber wall, the sleeve supported by the heater plate; and a first sealing element disposed at a first interface between the chamber wall and the chamber lid.

In some embodiments, a sleeve is provided. In some embodiments, the sleeve includes a chamber liner comprising a lower duct bounded by an inner wall, an outer wall, an upper wall, and a lower wall; and a pumping ring comprising an upper flange and a lower flange joined by a web, the web comprising a plurality of openings; wherein the upper flange is supported by the upper wall and the lower flange is supported by an upper end of the inner wall such that the pumping ring, the outer wall, and the upper wall form the boundary of an upper duct.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Methods and apparatus for processing substrates are disclosed herein. The inventive apparatus advantageously may enhance the performance of a hot wall reactor for processing substrates by providing a removable flow path for process gases and byproducts. The inventive apparatus may also enhance the performance of the seal elements in a hot wall reactor.

Figure 1:
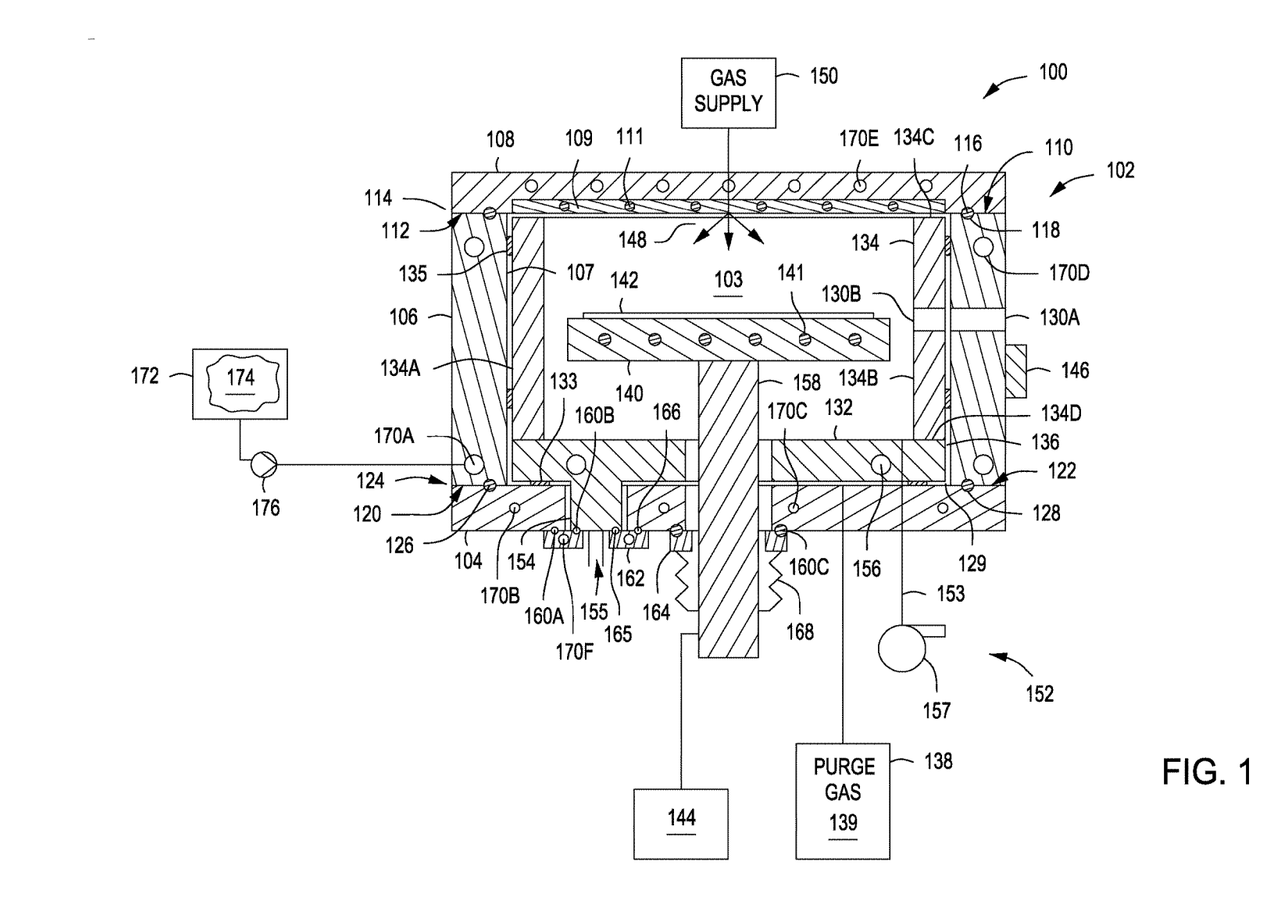
FIG. 1 depicts a side schematic view of a substrate processing apparatus according to embodiments of the present invention.

FIG. 1 depicts a side schematic view of a hot wall reactor, reactor 100 (e.g., a substrate process chamber), in accordance with some embodiments of the present invention. The reactor 100 may be any reactor suitable for performing one or more substrate processes, for example but not limited to, deposition process such as chemical vapor deposition (CVD), atomic layer deposition (ALD), or the like. The reactor may be a standalone reactor or a part of a cluster tool, such as one of the CENTURA®, PRODUCER®, or ENDURA® cluster tools available from Applied Materials, Inc. of Santa Clara, Calif.

In some embodiments, the reactor 100 may generally include a chamber body 102, comprising a chamber floor 104, a chamber wall 106 and a chamber lid 108 enclosing a processing volume 103. Components of the chamber body 102, including the chamber floor 104, the chamber wall 106, and the chamber lid 108, may be formed from any process compatible material, for example aluminum or stainless steel.

The chamber lid 108 is removably coupled to the chamber wall 106, with the top edge 110 of the chamber wall 106 and the bottom surface 112 of the chamber lid 108 forming a first interface 114. The chamber lid 108 may be coupled to the chamber wall 106 using any coupling element or elements (not shown) configured to draw the chamber lid 108 towards the chamber wall 106 to form the first interface 114. Alternatively, the chamber lid 108 may rest on the chamber wall 106 by gravity and the force generated due to the vacuum environment within the processing volume 103 during operation of the reactor 100. A sealing element 116 may be disposed in a recess or groove 118 formed at the first interface 114. The groove 118 may be formed in the top edge 110, in the bottom surface 112, or partially formed in the top edge 110 and partially formed in the bottom surface 112.

In some embodiments a lid heater 109 with one or more heating elements 111 may be coupled to or disposed adjacent to a process-chamber-facing portion of the chamber lid 108 to heat the process-chamber-facing portion of the chamber lid 108.

As illustrated in FIG. 1, the chamber wall 106 is adjacent to the chamber floor 104 and may be supported by the chamber floor 104. The chamber floor 104 and the chamber wall 106 can be formed as one piece or formed as separate pieces as shown. In embodiments in which the chamber floor 104 and the chamber wall 106 are separate pieces, a bottom edge 120 of the chamber wall 106 rests on a top surface 122 of the chamber floor 104 forming a second interface 124. A sealing element 126 may be disposed in a recess or groove 128 formed at the second interface 124. The groove 128 may be formed in the bottom edge 120, in the top surface 122, or partially formed in the bottom edge 120 and partially formed in the top surface 122. The chamber wall 106 may be joined to the chamber floor 104 using conventional fasteners, such as, for example, screws or bolts, or joining techniques, such as, for example, brazing or welding.

A heater plate 132 may be disposed within the processing volume 103 adjacent to the top surface 122 of the chamber floor 104. One or more protrusions 133 maintain a first gap 129 between the top surface 122 and the heater plate 132. The protrusions 133 may be formed on or disposed on the underside of the heater plate 132 or may be formed on or disposed on the top surface 122 in any suitable pattern, or may be separate pieces placed between the heater plate 132 and the top surface 122. The heater plate 132 may include a utilities feed (feed 154) extending through the chamber floor 104. The feed 154 may include electrical leads 155 to provide power to heater elements 156 in the heater plate 132.

A liner for the chamber, such as a sleeve 134, comprises an outer wall 134A, and inner wall 134B, an upper wall 134C, and a lower wall 134D. The sleeve may be disposed adjacent to the chamber wall 106 and maintained spaced apart from, and generally centered within, the chamber wall 106 by one or more protrusions 135. The sleeve 134 may be formed from any process compatible material including in non limiting examples, aluminum, stainless steel, or ceramic. In some embodiments, one or more surfaces of the sleeve 134 may be coated with a corrosion resistant coating, such as nickel plating. The protrusions 135 may be formed on the outer wall 134A of the sleeve 134 or formed on the inner surface of chamber wall 106 in any suitable pattern. The protrusions may also be separate pieces placed between the sleeve 134 and the chamber wall 106 to facilitate maintaining a spaced apart, generally centered, relationship. The sleeve 134 may be supported by the heater plate 132.

The chamber wall 106 may have one or more first openings (one opening 130A shown) to allow for a substrate 142 to be provided to, and removed from, the processing volume 103. The sleeve 134 may comprise a similar number of similarly configured second openings (one second opening 130B shown) aligned with the one or more first openings 130A to facilitate transport of the substrate into and out of the processing volume 130. A substrate transport mechanism (not shown), such as a robot, may be provided to transfer a substrate to and from the substrate support 140 through the first and second openings 130A and 130B. The first opening 130A may be selectively sealed via a slit valve 146, or other mechanism for selectively providing access to the processing volume 103 of the reactor 100 through the first and second openings 130A and 130B.

In some embodiments, the sleeve 134 and the heater plate 132 are integrally formed. In other embodiments, the sleeve 134 and the heater plate 132 are separately formed, as illustrated in FIG. 1. In some embodiments, the outer wall 134A and the inner surface of the chamber wall are parallel, or substantially parallel, and spaced apart such that a second gap 136 is formed between the outer wall 134A and the chamber wall 106. In some embodiments, the outer wall 134A and the inner surface 107 of the chamber wall 106 are radially expanding in an upward direction from the chamber floor 104 and the heater plate 132, respectively, such that the inner surface 107 and the outer wall 134A are outwardly tapered at an angle of between about 1 degree and 2 degrees from the vertical, for example 1.5 degrees, and maintaining parallelism. Providing the outer wall 134A and the inner surface 107 with an upward and outward taper advantageously significantly eases assembly of the components (e.g., insertion and removal of the sleeve 134.

The first gap 129 is in fluid communication with the second gap 136. In some embodiments, a purge gas source 138 is provided to supply a purge gas 139 to the first gap and second gap. In some embodiments, the purge gas 139 is provided to the first gap 129 and is caused to flow from the first gap 129 to the second gap 136. The purge gas 139 may be suitably provided to maintain a positive pressure in the first gap 129 and the second gap 136 as compared to the processing volume 103 during processing. The purge gas 139 may advantageously prevent process gases and process byproducts from flowing between the sleeve 134 and the chamber wall 106 and between the heater plate 132 and the chamber floor 104.

A substrate support 140 may be provided to support a substrate 142 for processing within the processing volume 103. In some embodiments, the substrate support 140 may include one or more heating elements 141 to provide heat energy to the substrate 142. The substrate support 140 may be supported by a shaft 158. A lift mechanism 144 may be coupled to the shaft 158 to provide vertical displacement to the substrate support 140 between a lower position (as shown) suitable for transferring substrates into and out of the chamber via the first and second openings 130A and 130B and a selectable upper position suitable for processing of the substrate 142. The lift mechanism 144, or a separate mechanism, may also control the rotational displacement of the substrate 142 by providing rotational displacement to the substrate support 140 through the shaft 158.

The reactor 100 may also include one or more gas inlets 148 fluidly coupled to a gas supply 150 for providing one or more process gases to the processing volume 103. The gas inlets 148 may enter the chamber body 102 through the chamber lid 108, as illustrated in FIG. 1. For example, in some embodiments, the gas inlets 148 may be arranged as a showerhead disposed within the chamber lid 108. Alternate or additional gas inlets may be provided through the chamber wall 106 of the chamber body 102.

An exhaust system 152 may be provided to exhaust process gases and process byproducts from the processing volume 103. The exhaust system 152 may include a conduit 153 coupled at one end to the processing volume 103. The other end of the conduit 153 is fluidly coupled to a vacuum pump, for example pump 157 to exhaust process gases and process byproducts from the processing volume 103.

In some embodiments, the sleeve 134 may further include passageways fluidly coupled to the exhaust system 152. For example, in the non-limiting embodiment of FIG. 2, the sleeve 134 comprises a chamber liner 202 and a pumping ring 220. The chamber liner comprises an inner wall 206, an outer wall 208 and an upper wall 210 and a lower wall 211. The lower end 212 of the inner wall 206 and the lower end 214 of the outer wall 208 are joined by the lower wall 211, and the lower wall 211 is supported on the heater plate 132. The outer wall 208 extends vertically upward from the lower end 214, generally parallel to the inner surface of the chamber wall 106, and terminates at an upper end 216. In some embodiments, the outer wall 208 is upwardly and outwardly divergent, with the outer wall 208 inclined at an angle of between about 1 degree and 2 degrees, for example 1.5 degrees from vertical.

Figure 2:
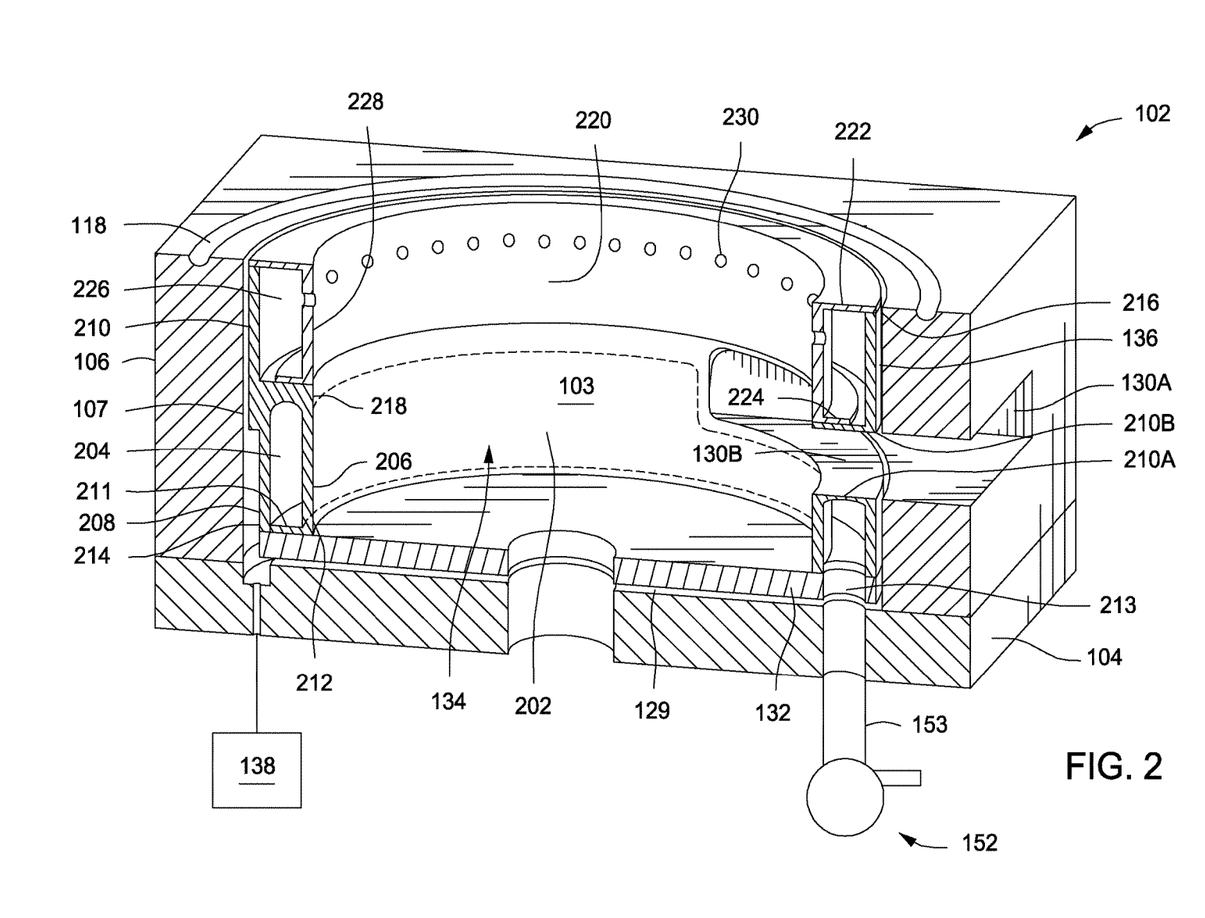
FIG. 2 is a simplified cross sectional view of a portion of a reactor according to embodiments of the present invention.

The inner wall 206 extends vertically from the lower end 212 to an upper end 218. The upper wall 210 connects the upper end 218 of the inner wall 206 and the outer wall 208 at a point between the lower end 214 and the upper end 216. In the area of the second opening 130B, the upper wall 210 bifurcates to form a first portion 210A below the second opening 130B, and a second portion 210B above the second opening 130B. The lower wall 211, the inner wall 206, a portion of the outer wall 208, and the upper wall 210 (or first portion 210A) form the boundary for the lower duct 204. In the area of the second opening 130B, the first portion 210A connects the upper end 218 of the inner wall 206 and the outer wall 208. The lower duct 204 extends around the perimeter of the chamber liner 202. The lower duct 204 may be a continuous path around the perimeter or may extend partially around the perimeter. An opening 213 is formed in the lower wall 211 to align with, and fluidly couple, the lower duct 204 with the exhaust system 152 via conduit 153.

A generally C-shaped (in cross-section) pumping ring 220 is supported on the chamber liner 202 with the upper flange 222 abutting the upper end 216 of the outer wall 208 and the lower flange 224 supported by the upper wall 210, for example on an upper surface of the upper wall 210 and second portion 210B of the upper wall. As illustrated in FIG. 2, the pumping ring 220, the outer wall 208, and the upper wall 210 form the boundary for the upper duct 226. If the second opening 130B is provided in the sleeve 134, the boundary for the upper duct comprises second portion 210B, the pumping ring 220, and the outer wall 208.

The chamber liner 202 and the pumping ring 220 may be formed from any process compatible material including in non-limiting examples aluminum, stainless steel, or ceramic.

The web 228 of the pumping ring 220 joins the upper flange 222 and the lower flange 224. The pumping ring 220 may include a plurality of passages or openings 230 through the web 228 providing fluid communication between the processing volume 103 and the upper duct 226. The openings 230 may be evenly spaced around the perimeter of the pumping ring. In some embodiments, the openings 230 are sized such that the total cross sectional area of all of the openings 230 is less than 50% of the cross sectional area of the upper duct 226.

Figure 3:
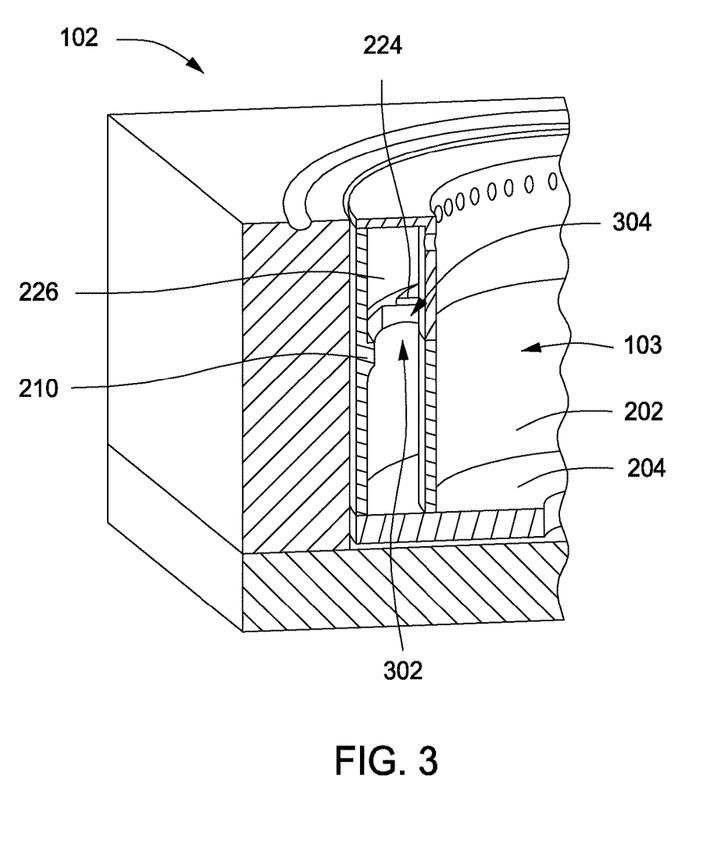
FIG. 3 depicts a partial cross sectional schematic view of a portion of the reactor of FIG. 2.

FIG. 3 schematically depicts a portion of the reactor 100 in cross section. At one or more locations around the perimeter of the chamber liner 202, the upper duct 226 and the lower duct 204 are fluidly coupled. For example, as illustrated in FIG. 3, an opening 302 is formed in the upper wall 210 and aligned with an interruption 304 of the lower flange 224 such that the upper duct 226 and the lower duct 204 are fluidly coupled.

A flow path may be established from the processing volume 103, through the openings 230 to the upper duct 226, to the lower duct 204, and to the exhaust system 152. The inventors have observed that various sizes and distribution patterns of openings 230 in the pumping ring 220 may favorably influence the exhaust of process gases, process byproducts, and the like from the processing volume 103. For example, in some embodiments, a first quantity of openings 230 of a first diameter provides beneficial flow path characteristics for certain processes within the processing volume 103. In other embodiments, a second, lesser quantity of openings 230 of a second, different diameter may provide beneficial flow path characteristics. The holes may be generally coplanar as illustrated, or may be arranged in any pattern around the perimeter. The inventors have observed that maintaining the total cross sectional area of all of the openings 230 to less than 50% of the cross sectional area of the upper duct 226 may facilitate formation of uniform flow characteristics around the perimeter of the pumping ring 220.

In some embodiments, for example, as shown in FIG. 1, the sleeve 134 is separate from the heater plate 132 and removable from the chamber body 102 for ease of cleaning, repair, and/or replacement. Similarly, in other embodiments as illustrated in FIG. 2, the chamber liner 202 and the pumping ring 220 are separate from the heater plate 132 and removable from the chamber body 102. In each embodiment, the sleeve 134, or the chamber liner 202 and pumping ring 220, is removable without necessitating the removal of the substrate support 140 or the heater plate 132. The inventors have noted that such ease of removal may lessen the time the reactor 100 is unavailable for production due to maintenance or repair.

Returning to FIG. 1, the chamber body 102 provides a vacuum boundary for the processing volume 103. Sealing elements 116 and 126 may facilitate formation of a seal resistant to gas infiltration between the chamber lid 108 and the chamber wall 106, and the chamber wall 106 and the chamber floor 104, respectively. Sealing element 116 and sealing element 126 may lessen or prevent the passage of undesirable gases across or through the first interface 114 and the second interface 124, respectively. The sealing elements 116, 126 are illustrated as having a circular cross section for ease of illustration only. Sealing elements of any suitable cross sectional shape may be used, for example rectangular, oval, or the like. The sealing elements 116, 126 may be formed from any suitable resilient material, for example, fluorinated hydrocarbons such as fluoroelastomers (e.g., Viton®) or perfluoroelastomers (e.g., Kalrez® or Chemraz®).

The sealing elements 116, 126 may be disposed at least partially within grooves 118, 128 formed at the first interface 114 and second interface 124, respectively. For example, groove 118 may be formed in the top edge 110, in the bottom surface 112, or partially formed in the top edge 110 and partially formed in the bottom surface 112. The groove 118 may be formed such that the sealing elements 116 is compressed when the top edge 110 and bottom surface 112 are drawn together to form the first interface 114. A similar configuration may be provided for the groove 128 for sealing element 126.

Additional sealing elements may be provided with similar configurations at breaches to the vacuum boundary of the chamber body 102. For example, as illustrated in FIG. 1, sealing elements 160A and 160B may be provided at the breach caused by the feed 154. A sealing ring, for example, ring 162, may be provided around the feed 154. An inner portion of the ring 162 may be coupled to the feed 154 with the sealing element 160B disposed in a groove 165 formed at the interface between the inner portion of the ring 162 and the feed 154. Similarly, an outer portion of the ring 162 may be coupled to the chamber floor 104 with the sealing element 160A disposed in a groove 166. The ring 162 may be coupled to the chamber floor 104 and the feed 154 using any suitable coupling mechanism, for example threaded fasteners such as screws or bolts.

In a similar fashion, ring 164 may facilitate the formation of a vacuum seal between the shaft 158 and the chamber floor 104. As above, a sealing element 160C may be disposed in a groove formed at the interface of the ring 164 and the chamber floor 104, and the ring 164 coupled to the chamber floor 104. A bellows 168 may be joined to the ring 164 at a first end in a vacuum-tight manner. A second end of the bellows 168 may be similarly joined to an element of the reactor 100, for example the shaft 158, to form a portion of a vacuum boundary.

One or more passages adapted for the flow of a thermal media, for example passages 170A-170F, may be formed in components of the chamber body 102, for example, the chamber floor 104, the chamber wall 106, and/or the chamber lid 108. In some embodiments, the passages 170A-170F may be disposed proximate to grooves formed in the components of the chamber body, for example, groove 118 and groove 128, and fluidly coupled to a thermal media source, such as source 172. The source 172 may include a circulator or pump 176 to cause the thermal media 174 to flow through the passages 170A-170F. The flow of the thermal media 174 may facilitate the thermal control of portions of the chamber body 102. For example, flowing thermal media 174 through passages 170A and 170D may provide thermal control, or facilitate the thermal control, of a lower portion and an upper portion, respectively, of the chamber wall 106. Similar thermal control can be provided in the chamber floor 104 or the chamber lid 108. In some embodiments, one or more cooling passages may be provided in the rings, for example passage 170F in ring 162, to provide similar benefits.

Flowing a thermal media in the components of the chamber body 102 (e.g., the chamber floor 104 and the chamber wall 106) may reduce the temperature of the components at the interface between adjacent components, for example, first interface 114 and second interface 124. In turn, the sealing elements are exposed to the lower temperature of the interface which may lead to enhanced performance of the seal element 116 and seal element 126. The inventors have noted a number of benefits associated with the reactor configuration discussed above. For example, the inventors have noted that the rate of gas permeation of the sealing elements increases with the temperature of the sealing elements. The inventors have also noted that the rate of physical degradation of the sealing elements increases with temperature. By placing the sealing elements 116, 126 at the interface of chamber components with reduced processing temperatures, for example, by providing a gap between heated chamber components and the chamber walls and/or by flowing thermal media as discussed above, the inventors have noted reduced gas permeability as well as a reduced rate of degradation of the seal elements, thereby advantageously increasing the service life of the seal elements 116, 126.

Similar thermal control can be provided for the additional sealing elements discussed above, for example, sealing element 160A and sealing element 160B. As illustrated in FIG. 1, passage 170B and passage 170C may be disposed in the chamber floor 104 proximate to the breach for the feed 154 or the breach for the shaft 158. Flowing thermal media 174 through passages 170B and 170C may provide thermal control, or facilitate the thermal control, of the chamber floor 104 proximate to the sealing element 160A and sealing element 160B at the feed 154, and sealing element 160C and the shaft 158.

Elements of the above-described embodiments may be combined in various ways to advantageously provide combinations of benefits provided by the different elements. For example, in some embodiments, an apparatus for processing substrates may be provided that includes: a chamber body enclosing a processing volume, the chamber body comprising a chamber floor, a chamber wall coupled to the chamber floor, and a chamber lid removably coupled to the chamber wall, wherein at least one of the chamber floor, the chamber wall, and the chamber lid comprise passages for a flow of a thermal control media; a heater plate disposed adjacent to and spaced apart from the chamber floor; a sleeve disposed adjacent to and spaced apart from the chamber wall, the sleeve supported by the heater plate; and a first sealing element disposed at a first interface between the chamber wall and the chamber lid.

In some embodiments, the apparatus of the above example may be modified wherein the heater plate is spaced apart from the chamber floor by a first gap, wherein the chamber liner is spaced apart from the chamber wall by a second gap, and wherein the first gap and the second gap are in fluid communication.

In some embodiments, the apparatus of the above example may further comprise a purge gas port disposed in the chamber body to provide a purge gas to at least one of the first gap and the second gap.

In some embodiments, in the apparatus of any the above examples, the sleeve may comprise: a chamber liner comprising a lower duct bounded by an inner wall, an outer wall, an upper wall, and a lower wall; and a pumping ring comprising an upper flange and a lower flange joined by a web, wherein the upper flange is supported by the upper wall and the lower flange is supported by an upper end of the inner wall such that the pumping ring, the outer wall, and the upper wall form the boundary of an upper duct.

In some embodiments, the apparatus of the above example may further comprise an exhaust system fluidly coupled to the lower duct. Alternatively or in combination, the web may include a plurality of openings to provide fluid communication between the processing volume and the upper duct. Alternatively or in combination, the upper duct and the lower duct may be fluidly coupled.

In some embodiments, in the apparatus of any the above examples, the sleeve may be removable from the chamber body.

In some embodiments, the apparatus of any the above examples may further comprise a second sealing element disposed at a second interface between the chamber wall and the chamber floor.

In some embodiments, in the apparatus of any the above examples, the heater plate and the sleeve may be formed as one piece.

In some embodiments, the apparatus of any the above examples may further comprise a substrate support disposed within the processing volume and supported for at least one of vertical and rotational displacement.

In some embodiments, in the apparatus of the above example, the substrate support may comprise a heater disposed therein.

In some embodiments, in the apparatus of any the above examples, the chamber body may comprise a vacuum boundary of the processing volume.

In some embodiments, in the apparatus of any the above examples, the flow of thermal media in the passages may facilitate the thermal control of at least a portion of one of the chamber floor, the chamber wall, or the chamber lid.

In some embodiments, in the apparatus of any the above examples, an inside surface of the chamber wall may be outwardly tapered from the chamber floor at an angle form about 1 degrees to about 2 degrees from vertical.

In some embodiments, in the apparatus of any the above examples, an outside surface of the sleeve may be outwardly tapered from the heater plate at an angle of between about 1 degree and 2 degrees.

In some embodiments, in the apparatus of any the above examples, the chamber wall may comprise a first opening and the sleeve may comprise a similarly configured second opening, wherein the first opening and the second opening are aligned.

In some embodiments, an example of a sleeve for use as a chamber liner may include: a chamber liner comprising a lower duct bounded by an inner wall, an outer wall, an upper wall, and a lower wall; and a pumping ring comprising an upper flange and a lower flange joined by a web, the web comprising a plurality of openings, wherein the upper flange is supported by the upper wall and the lower flange is supported by an upper end of the inner wall such that the pumping ring, the outer wall, and the upper wall form the boundary of an upper duct.

In some embodiments, in the sleeve of the above example, the outer wall may taper outwardly from the lower wall. In some embodiments, the taper may be from about 1.0 degrees to about 2.0 degrees.

In some embodiments, the sleeve of the above example may further comprise an opening in the lower duct to couple the lower duct to an exhaust system. Alternatively or in combination, the web may include a plurality of openings to provide fluid communication between a processing volume of a process chamber and the upper duct. Alternatively or in combination, the upper duct and the lower duct may be fluidly coupled.

While the foregoing is directed to embodiments of the present invention, other and further embodiments of the invention may be devised without departing from the basic scope thereof.

The invention claimed is:

1. An apparatus for processing substrates, comprising:
   a chamber body enclosing a processing volume, the chamber body comprising a chamber floor, a chamber wall coupled to the chamber floor, and a chamber lid removably coupled to the chamber wall, wherein at least one of the chamber floor, the chamber wall, and the chamber lid comprise passages for a flow of a thermal control media;
   a heater plate disposed adjacent to and spaced apart from the chamber floor;
   a sleeve disposed adjacent to and spaced apart from the chamber wall, the sleeve supported by the heater plate, wherein the sleeve comprises:
     a chamber liner comprising a lower duct bounded by an inner wall, an outer wall, an upper wall, and a lower wall; and
     a pumping ring comprising an upper flange and a lower flange joined by a web, wherein the upper flange is supported by the upper wall and the lower flange is supported by an upper end of the inner wall such that the pumping ring, the outer wall, and the upper wall form the boundary of an upper duct; and
   a first sealing element disposed at a first interface between the chamber wall and the chamber lid.

2. The apparatus of claim 1, wherein the heater plate is spaced apart from the chamber floor by a first gap, wherein the sleeve is spaced apart from the chamber wall by a second gap, and wherein the first gap and the second gap are in fluid communication.

3. The apparatus of claim 2, further comprising a purge gas port disposed in the chamber body to provide a purge gas to at least one of the first gap and the second gap.

4. The apparatus of claim 1, further comprising an exhaust system fluidly coupled to the lower duct.

5. The apparatus of claim 1, wherein the web includes a plurality of openings to provide fluid communication between the processing volume and the upper duct.

6. The apparatus of claim 1, wherein the upper duct and the lower duct are fluidly coupled.

7. The apparatus of claim 1, wherein the sleeve is removable from the chamber body.

8. The apparatus of claim 1, further comprising a second sealing element disposed at a second interface between the chamber wall and the chamber floor.

9. The apparatus of claim 1, wherein the heater plate and the sleeve are formed as one piece.

10. The apparatus of claim 1, further comprising a substrate support disposed within the processing volume and supported for at least one of vertical and rotational displacement.

11. The apparatus of claim 10, wherein the substrate support comprises a heater disposed therein.

12. The apparatus of claim 1, wherein the chamber body provides a vacuum boundary of the processing volume.

13. The apparatus of claim 1, wherein an inside surface of the chamber wall is outwardly tapered from the chamber floor, and wherein an outside surface of the sleeve is outwardly tapered from the heater plate.

14. The apparatus of claim 13, wherein the inside surface of the chamber wall is outwardly tapered from the chamber floor at an angle form about 1 degrees to about 2 degrees from vertical, and wherein the outside surface of the sleeve is outwardly tapered from the heater plate at an angle of between about 1 degree and 2 degrees.

15. An apparatus for processing substrates, comprising:
   a chamber body enclosing a processing volume, the chamber body comprising a chamber floor, a chamber wall coupled to the chamber floor, and a chamber lid removably coupled to the chamber wall, wherein at least one of the chamber floor, the chamber wall, and the chamber lid comprise passages for a flow of a thermal control media;
   a heater plate disposed adjacent to and spaced apart from the chamber floor by a first gap;
   a sleeve disposed adjacent to and spaced apart from the chamber wall by a second gap, the sleeve supported by the heater plate, wherein the first gap and the second gap are in fluid communication, wherein the sleeve is removable from the chamber body, and wherein the sleeve comprises
     a chamber liner comprising a lower duct bounded by an inner wall, an outer wall, an upper wall, and a lower wall; and
     a pumping ring comprising an upper flange and a lower flange joined by a web, wherein the upper flange is supported by the upper wall and the lower flange is supported by an upper end of the inner wall such that the pumping ring, the outer wall, and the upper wall form the boundary of an upper duct, wherein the web includes a plurality of openings to provide fluid communication between the processing volume and the upper duct, and wherein the upper duct and the lower duct are fluidly coupled; and
   a first sealing element disposed at a first interface between the chamber wall and the chamber lid.

16. The apparatus of claim 15, wherein an inside surface of the chamber wall is outwardly tapered from the chamber floor at an angle form about 1 degrees to about 2 degrees from vertical, and wherein an outside surface of the sleeve is outwardly tapered from the heater plate at an angle of between about 1 degree and 2 degrees.

17. A sleeve for use in a substrate process chamber, comprising:
- a chamber liner comprising a lower duct bounded by an inner wall, an outer wall, an upper wall, and a lower wall; and
- a pumping ring comprising an upper flange and a lower flange joined by a web, the web comprising a plurality of openings;
- wherein the upper flange is supported by the upper wall and the lower flange is supported by an upper end of the inner wall such that the pumping ring, the outer wall, and the upper wall form the boundary of an upper duct.

18. The sleeve of claim 17, wherein the outer wall tapers outwardly from the lower wall.

19. The sleeve of claim 18, wherein the taper is from about 1.0 degrees to about 2.0 degrees.

\* \* \* \* \*